United States Patent
Saeva

[11] 3,957,344
[45] May 18, 1976

[54] INFORMATION TRANSFER SYSTEM
[75] Inventor: Franklin D. Saeva, Webster, N.Y.
[73] Assignee: Xerox Corporation, Stamford, Conn.
[22] Filed: Mar. 26, 1975
[21] Appl. No.: 562,066

[52] U.S. Cl............................ 350/150; 350/160 LC
[51] Int. Cl.² .......................................... G02F 1/13
[58] Field of Search .............. 350/150, 154, 160 LC

[56] References Cited
UNITED STATES PATENTS
3,780,307  11/1975  Saeva.............................. 350/150 X Primary Examiner—Edward S. Bauer
Attorney, Agent, or Firm—James J. Ralabate; Michael H. Shanahan; George J. Cannon

[57] ABSTRACT

The optical transitions of extrinsically optically active soluble and insoluble materials become circularly dichroic when in contact with the twisted nematic structure of nematic liquid crystalline materials. The circularly dichroic optical properties induced in the normally extrinsically optically active materials can be utilized for information transfer applications.

20 Claims, 4 Drawing Figures

FIG. I

INFORMATION TRANSFER SYSTEM

BACKGROUND OF THE INVENTION

This invention relates to liquid crystalline materials and, particularly, to uses of the combination of the twisted nematic structure in nematic liquid crystalline materials in contact with extrinsically optically active materials. More particularly, this invention relates to the use of the discovery that the optically active materials display circular dichroism when in contact with the twisted nematic structure in nematic liquid crystalline materials.

Liquid crystalline substances exhibit physical characteristics, some of which are typically associated with liquids and others which are typically unique to solid crystals. The name "liquid crystals" has become generic to substances exhibiting these dual properties. Liquid crystals are known to appear in three different forms: the smectic, nematic, and cholesteric forms. These structural forms are sometimes referred to as mesophases thereby indicating that they are states of matter intermediate between the liquid and crystalline states. The three mesophase forms of liquid crystals mentioned above are characterized by different physical structures wherein the molecules of the compound are arranged in a manner which is unique to each of the three mesomorphic structures. Each of these three structures is well known in the liquid crystal art.

The twisted nematic structure is well known in the art. When a nematic liquid crystalline material is sandwiched between substrates treated for unidirectional homogeneous alignment, the nematic is externally perturbed into a helical structure when the rubbed surfaces are placed at some angle (other than 0°) with respect to one another. See, for example, M. Schadt and W. Helfrich, Appl. Phys. Lett., 18, 127 (1971), "Voltage-Dependent Optical Activity of A Twisted Nematic Liquid Crystal".

Twisted nematic cells have been employed in display devices, particularly where electro-optic effects are modulated by the application of an electrical field across layers of nematic liquid crystalline meterial in the twisted nematic structure. See, for example, U.S. Pat. No. 3,731,986 to Fergason and 3,781,085 to Leibowitz.

The molecules of the nematic in the twisted structure of nematic liquid crystals can be thought of as arranged in very thin layers with the long axes of the molecules parallel to each other and to the local optic axes of the layers. The direction of the long axes of the molecules in each layer is displaced slightly from the corresponding direction in adjacent layers. This displacement is cumulative over successive layers so that overall displacement traces out a helical path. A comprehensive description of the optical properties of the twisted nematic structure of nematic liquid crystals is given in "Optics in Smoothly Varying Anisotropic Planar Structures: Application to Liquid-Crystal Twist Cells", D. W. Berreman, 63, *J. Opt. Soc. Am.*, 1374 (1973).

Nematic liquid crystals in the twisted structure rotate the plane of polarization of light passing therethrough an amount between 0° and 90° equal to the angular difference between the alignment directions of the substrates. The intrinsic sense of the helical twist can be either right-handed or left-handed.

Extremely large extrinsic circular dichroism has been observed within the electronic transitions of achiral (optically inactive) solutes dissolved in cholesteric mesophases as reported in recently issued U.S. Pat. No. 3,780,304 to F. D. Saeva, et al and in the following articles by F. D. Saeva et al appearing in the *Journal of the American Chemical Society* (JACS): "Cholesteric Liquid-Crystal-Induced Circular Dichroism (LCICD) of Achiral Solutes. A Novel Spectroscopic Technique", Vol. 94, JACS, page 5135 (1972); "Cholesteric Liquid-Crystal-Induced Circular Dichroism (LCICD). V. Some Mechanistic Aspects", Vol. 95, JACS, page 7675 (1973); "Cholesteric Liquid-Crystal-Induced Circular Dichroism (LCICD). VI. LCICD Behavior of Benzene and Some of its Mono- and Disubstituted Derivatives", Vol. 95, JACS, page 7660 (1973); and "Cholesteric Liquid-Crystal-Induced Circular Dichroism (LCICD). VII. LCID of Achiral Solutes in Lyotropic Cholesteric Mesophases", Vol. 95, JACS, page 7882 (1973).

To our knowledge, circular dichroism has not been previously reported as induced in extrinsically optically active materials in contact with the twisted structure of nematic liquid crystalline materials.

It has heretofore been thought by those working in the art as evidenced by the above articles that two mechanisms contributed independently to the existence of Liquid Crystal Induced Circular Dichroism in dissolved materials: (1) helical organization of solute, and (2) the exposure of solute to a helical organization of liquid crystal molecules. My work prior to the present invention indicated that mechanism (2) could be the sole operative mechanism. Shortly after the invention described in this Applicaton, independent data was reported which confirmed that mechanism (1) was not required for the observation of extrinsic LCICD within solutes in the cholesteric mesophase. That is, the solute molecules need not be ordered into helical organization by the mesophase in order to exhibit liquid crystal induced circular dichroism. The data reported in "The Optical Activity of Achiral Molecules in a Cholesteric Solvent", J.C.S. Chem. Comm., page 712, 1973.

SUMMARY OF THE INVENTION

It is an object of the invention to provide an information transfer system utilizing circular dichroism induced in normally extrinsically optically active materials in contact with the twisted nematic structure of nematic liquid crystalline materials.

The above mentioned objects and advantages and others are realized in accordance with the invention by employing normally extrinsically optically active materials where electronic transitions, i.e., effect obtained from the interaction of light energy with the electrons of the molecules, become circularly dichroic; i.e., show a large preferential absorption of either left hand circularly polarized light (LHCPL) or right hand circularly polarized light (RHCPL) when in contact with the twisted nematic structure of nematic liquid crystalline materials. As used herein, "in contact" includes dissolution of soluble extrinsically optically active material as well as mere physical contact between the nematic and insoluble extrinsically optically active material. It should be understood that by the term "extrinsically optically active materials" we mean both intrinsically optically active and intrinsically optically inactive materials which are optically active or inactive, respectively, out of contact (or when not in contact) with twisted nematic liquid crystalline substances. Both intrinsically optically active materials and optically inactive materials become extrinsically optically active when contacted with the twisted nematic structure of nematic liquid crystalline materials. This extrinsic induced behavior may overwhelm and dominate over any intrinsic activity since the specific rotations and molecular ellipticities in the former case are normally substantially larger than that observed for intrinsically optically active materials.

The extrinsically optically active materials can be soluble or insoluble in the nematic liquid crystalline material and, if insoluble, can be either dispersed in the nematic or provided as a coating in contact with the nematic. Dissolution, dispersion and coating contact all meet the requirement that the extrinsically optically active material be "in contact" with the twisted nematic structure of the nematic liquid crystalline material.

"Insoluble" is used herein to mean that dissolution of the material added to or contacted by the nematic liquid crystalline material can not be detected by conventional photometric techniques, such as circular dichroism and optical absorption.

It has been found that when such extrinsically optically active materials are dissolved in or otherwise contacted by twisted nematics, the optically active materials exhibit circularly dichroic behavior within their absorption bands. The optical behavior induced in the normally extrinsically optically active materials is circular dichroism; i.e., a difference in absorption of RHCPL and LHCPL; however, the materials show a large preference for absorbing one type more than the other type as further discussed below.

The invention will be more fully understood from the following detailed description of various preferred embodiments thereof, particularly when read in conjunction with the accompanying drawings wherein.

Figure 4:
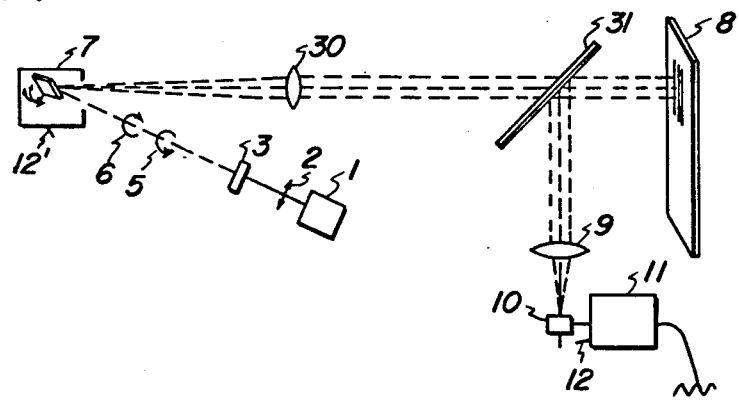

FIG. 4 schematically illustrates a scheme whereby circular dichroism information is read from a liquid crystalline film by optical reflection therefrom and whereby such read information is converted into synchronized signals.

Figure 1:
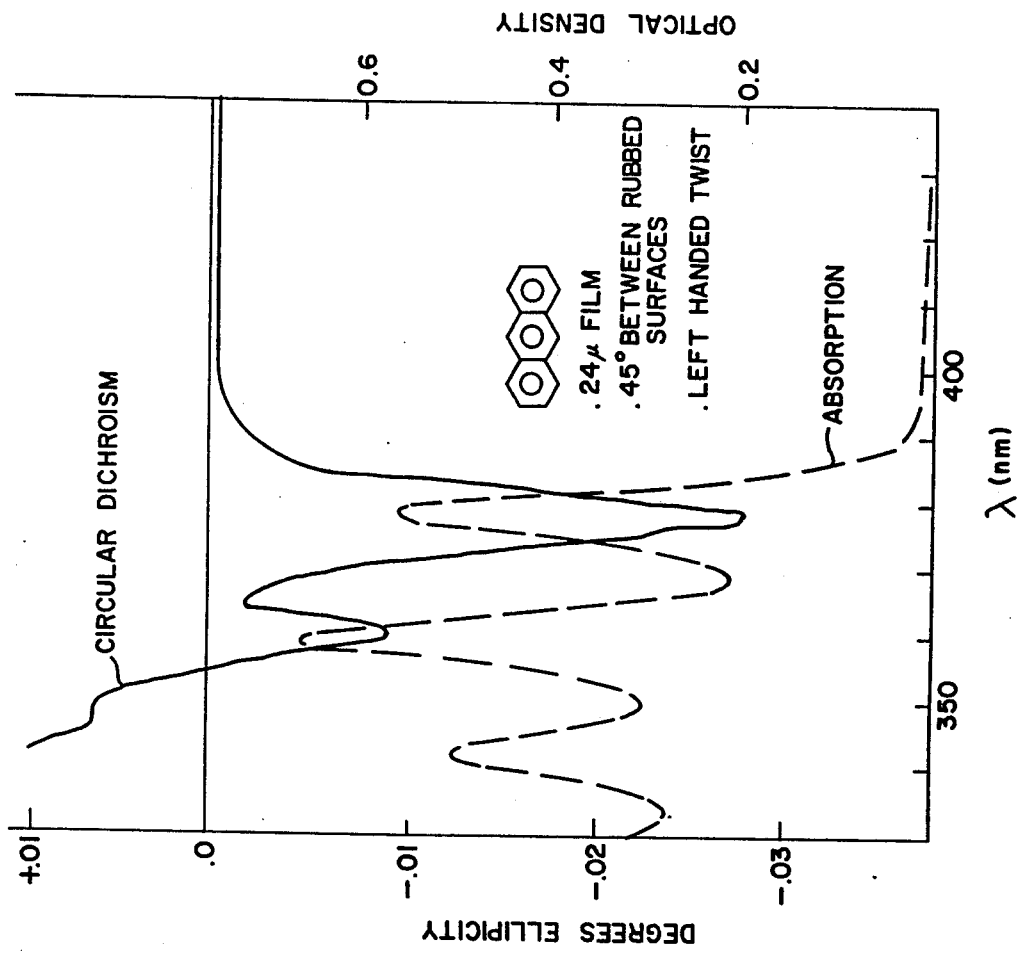
FIG. 1 shows the circular dichroism and absorption spectra of anthracene in the twisted nematic structure of a 1:1 weight ratio of p-cyanophenyl-p-butyl benzoate and p-cyanophenyl-p-heptylbenzoate.

Referring now to FIG. 1, there is seen the circular dichroism and absorption spectrum of an about 24 micron thick film of anthracene dissolved in a 1:1 weight ratio of p-cyanophenyl-p-butylbenzoate and p-cyanophenyl-p-heptylbenzoate. The anthracene comprises about 1 wt. % of the solution. The nematic is provided with a left handed 45° twist between the alignment directions of the top and bottom rubbed substrates. The circular dichroism induced in the 360 and 380 nm absorption bands of the anthracene is negative in sign; that is, more right-handed circularly polarized light is absorbed than left-handed circularly polarized light. Conversely, more left-handed circularly polarized light is transmitted than right-handed circularly polarized light.

In the left handed helical structure CD bands of negative sign ($\epsilon_R > \epsilon_L$) appear at about 360 and 380 nm while positive CD bands appear at about 340 nm. It has been found that the sign of the circular dichroism induced in normally extrinsically optically active material dissolved in a twisted nematic structure depends upon the polarizaton of the optical transition of the additive, and the pitch and sense of twist of the nematic. If the polarization of optical transition of the additive is perpendicular (that is to say, the optical transition moment is aligned perpendicular to the local optic axis of the nematic layers) then the CD sign is negative with a left-handed twisted nematic and is positive with a right handed twisted nematic. If the polarization of optical transition is parallel, then the CD sign is positive with a left-handed twisted nematic and is negative with a right handed twisted nematic.

The sign of circular dichroism induced in insoluble extrinsically optically active materials is independent of the optical transition polarization of the material and is negative for a left hand twisted nematic and positive for a right hand twisted nematic.

Thus, it can be seen that the addition of extrinsically optically active materials whose absorption bands become highly optically active when in contact with a twisted nematic liquid crystalline environment permits a novel and highly advantageous means for tailoring the properties of twisted nematic liquid crystal systems to achieve novel and extremely useful results. These additives can be used to provide a circularly dichroic absorption band.

The additives which can be placed in contact with twisted nematic liquid crystalline substances according to the invention can be soluble or insoluble (as previously defined) in the twisted nematic environment and should have optical transitions in some regions of the electromagnetic spectrum. Any suitable extrinsically optically active soluble or insoluble material can be used according to the invention. Typical suitable extrinsically optically active materials include, among others, soluble or insoluble organic and inorganic dyes and pigments, aromatic compounds such as benzene, naphthalene, anthracene, and the like; azo compounds such as arylazonaphthols, azobenzenes, etc.; nitro compounds such as nitrobenzene, nitroarylazonaphthols and the like; nitroso compounds such as nitrosonaphthalene and the like; compounds such as benzylidene aniline, etc., carbonyl compounds such as acetone, acetophenone, benzophenone and the like; thiocarbonyls such as thioacetophenones, thioacetone, thiobenzophenone, and the like; alkenes such as butadiene, cyclohexane, etc.; heterocyclics such as furans, aziridines, pyridines and the like, alkanes such as hexane, dodecane, and the like; metallic complexes; dyes such as polymethin, sulfur, indigo and anthraquinone dyes; and mixtures thereof.

Typical methods of insolubilizing any of the above soluble compounds include adsorbing on suitable surfaces and converting to ionic derivatives.

Generally speaking, the use of extrinsically optically active additive materials that absorb in the visible region of the spectrum such as, for example, inorganic and organic pigments, will be preferred in applications where visible light is to be employed.

Of course, it should be recognized that the above classes of materials are intended to be only illustrative of the insoluble and soluble additives which will provide the induced circular dichroism behavior.

The amount of material which can be dissolved or dispersed in a twisted nematic structure can vary over an extremely wide range. As little as about 0.01% by weight of optically active material in the solution or dispersion can provide the induced optical activity. Of course, the upper limit of the amount of additive which can be incorporated into any particular nematic liquid crystal composition, and which can go as high as about 90% by weight, is controlled by the requirement that the total environment must retain its twisted nematic character after the addition of the optically active material (soluble and insoluble).

Any suitable nematic liquid crystal substance, mixtures thereof or combinations having nematic liquid crystalline characteristics may be employed in the invention. When chromic changes of the extrinsically optically active material are utilized to create an imagewise pattern of circular dichroism the sign of the dielectric anisotropy of the nematic is immaterial. Chromic changes causing selective shifts of the absorption bands of the extrinsically optically active materials is discussed later. When the existence or intensity of circular dichroism is controlled by electrical fields then the nematic must be of positive dielectric anisotropy. Typical suitable nematic liquid crystals include p-azoxyanisole, p-azoxyphenetole, p-butoxybenzoic acid, p-methoxy-cinnamic acid, butyl-p-anisylidene-p-anisylidene-p-aminocinnamate, anisylidene para-aminophenylacetate, p-ethoxy-benzylamino-a-methyl-cinnamic acid, 1,4-bis(p-ethoxy benzylidene) cyclohexanone, 4,4′-dihexyloxybenzene, 4,4′-diheptyloxybenzene, anisal-p-amino-benzene, anisaldazine, a-benzencazo-(anisal-α′-naphthylamine), n,n′-nonoxybenzyltolinidine; anils of the generic group (p-n-alkoxybenzylidene-p-n-alkyanilines), such as p-methoxybenzylidene-p′-n-butylaniline; nematic compounds of the alkoxybenzylidene-amino-alkylphenone group, such as methoxybenzylidene-aminobutyrophenone and methoxybenzylidene-amino-valerophenone; p-cyanophenyl-p-butyl benzoate and p-cyanophenyl-p-heptylbenzoate; mixtures of the above and others.

The nematic liquid crystalline composition having positive dielectric anisotropy can comprise any suitable nematic dichrois is liquid crystalline material having positive dielectric anisotropy, or a mixture of nematic liquid crystalline materials with materials having positive dielectric anisotropy, or a mixture of positive and negative dielectric anisotropy nematics which yield a net positive dielectric anisotropy nematic composition.

Typical suitable nematic liquid crystalline materials having positive dielectric anisotropy are well known in the liquid crystalline art and need not be listed in detail herein. These include cyanoaniline compounds such as p-hexyloxy-benzyliden-p′-cyanoaniline and p-heptyloxybenzilidene-p′-cyanoaniline disclosed by M. Schadt and W. Helfrich in Appl. Phys. Letts., 18, 127 (1971); nematic esters such as p-cyanophenyl-p-butylbenzoate and p-cyanophenyl-p-heptylbenzoate, both available from Aldrich Chemical Company; and butyl-p, p-ethoxyphenoxycarbonylphenyl carbonate, available from Eastman Chemical Products, Inc.

Typical suitable materials having positive dielectric anisotropy include smectic liquid crystalline materials having positive dielectric anisotropy such as p-methoxybenzylidene-p′-trifluoromethylaniline and p-heptyloxybenzylidene-p′-trifluoromethylaniline. These materials can be conveniently prepared by starting with about 0.01 mole of either p-methoxybenzylidene or p-heptyloxybenzaldehyde, depending upon the product desired. The starting compound is refluxed with p-trifluoromethylaniline for about 4 hours in about 100 cc of absolute ethanol to which a trace of p-toluenesulfonic acid has been added. The water produced in the reaction is removed by azeotroping over the 95% ethanol into a Dean-Stark trap. The reaction mixture is allowed to cool to room temperature and the crude product is crystallized from solution. The resulting product is recrystallized from hexane and yields about 0.06 moles of purified product. The purified p-methoxybenzylidene-p′-trifluoromethylaniline is mesomorphic from about 50° to about 87°C, and the purified p-heptyloxybenzylidene-p′-trifluoromethylaniline is mesomorphic from about 38 to about 82°C.

The positive dielectric anisotropic materials, including positive dielectric anisotropic smectics, to be added to nematic liquid crystalline materials can be added in any amount so long as the resulting composition retains the nematic mesomorphic state. Similarly, when mixtures of positive and negative dielectric anisotropic nematics are to be utilized, the amount of negative dielectric anisotropic nematic can be added in any amount so long as the resulting composition has a net positive dielectric anisotropy. Negative dielectric anisotropy nematic liquid crystalline materials are well known in the art and need not be listed in detail herein. Typical suitable negative dielectric anisotropy nematic liquid crystalline materials include N-(p-methoxybenzilidene)-p-butylaniline (MBBA); p-azoxyanisole (PAA); N-(p-ethoxybenzylidene)-p-butyl-aniline (EBBA); dl-4-(2-methylhexyl)-4′-ethoxy-α-chloro-trans-stilbene; pp′-methoxypentyltolane, ethoxybenzylidene-p′-amino-phenyl-3-methyl valerate, and trans-4-butyl-α-chloro-4′-ethoxy-stilbene.

Mixtures of liquid crystals can be prepared in organic solvents such as chloroform, petroleum ether and others which are typically evaporated from the mixture leaving the liquid crystal composition. Alternatively, the individual components of the liquid crystalline mixture can be combined directly by heating the mixed components above the isotropic transition temperature.

The above lists of typical suitable nematic liquid crystalline substances are intended to encompass mixtures of the above. These lists are intended to be representative only and are not to be construed as being exhaustive or limiting the invention to the specific materials mentioned. Although any nematic liquid crystalline material provided in the twisted nematic structure is suitable for use in the present invention, it should be recognized that various different nematic liquid crystal substances will only possess the necessary properties which make then suitable for use according to the invention at some specific temperature range which may be at room temperature or substantially below or above room temperature. However, all of the various substances, mixtures or combinations thereof will function according to the method ot some temperature. Typically, the materials of the invention will be used at or near room temperature. Thus, it is preferred to employ liquid crystal substances which have a liquid crystal state at or near room temperature. Generally speaking, the liquid crystal substances will preferably be in the liquid crystal state at the desired operational temperature.

Typical suitable thicknesses of films or layers of nematic liquid crystalline materials are from about 0.5 to about 50 microns, although any thickness which will provide the desired effect can be used.

The twisted nematic structure is provided by sandwiching the nematic liquid crystalline material between two substrates or electrodes treated to impart unidirectional homogeneous alignment wherein the homogeneous alignment direction of one substrate makes an angle between 0° and 90° with the homogeneous alignment direction of the other substrate.

The substrates or electrodes may be treated by any technique suitable for providing homogeneous alignment of the nematic liquid crystalline material. Typical suitable techniques include the Chatelain technique of unidirectional rubbing as disclosed in P. Chatelin, *Bull. Soc. Franc. Min. Crist.*, 66, 105 (1943); providing a coating of aligning agent in contact with layer 4 of nematic liquid crystalline material such as, for example, one of the homogeneous aligning agents listed in Vol. 61, No. 7, *Proceedings of the IEEE*, p. 823, July, 1973 in the article "Surface-Produced Alignment of Liquid Crystals" by Kahn, Taylor and Schonhorn; and the so-called Janning Technique described by J. L. Janning in *Appl. Phys. Letts.*, 21, 173 (1972).

The nematic liquid crystalline material is provided in the twisted nematic structure by about 0° to about 90° angular displacement between alignment directions of the treated substrates. The Chatelain and other surface treatments for homogeneous alignment can be employed. The substrates can be treated for the same direction alignment and one rotated or twisted from about 0° to about 90° with respect to the other to provide the angular displacement, or one substrate can be treated at an angle with respect to the treatment for the other substrate in order to provide the angular displacement. The direction of angular displacement determines the chirality or sense of twist of the twisted nematic structure. The standard used herein is the direction going from the bottom substrate to the top substrate, within about 0° to about 90°. If the direction from the bottom substrate alignment direction to the top substrate alignment direction within 0° to 90° is counterclockwise then the chirality of the helix is left handed. If the direction from the bottom substrate alignment direction to the top substrate alignment direction within about 0° to about 90° is clockwise then the chirality of the helix is right-handed.

The substrates or electrodes may be of any shape and the homogeneous alignment treatment may employ aligning agents and angular film deposition (Janning Technique). Further, the substrates may both be treated to have the same alignment direction and the top substrate is then twisted or rotated to form an angle of from about 0° to about 90° with the other. A clockwise rotation of the top with respect to the bottom results in a right-handed sense of twist. A counterclockwise rotation of the top with respect to the bottom results in a left-handed sense of twist.

Once the chirality or sense of twist is established, it remains the same for when the cell is flipped over so that the former bottom substrate is now the top substrate. This can be easily visualized by crossing two pencils and viewing them from opposite sides.

At exactly 0° or no angular displacement there is homogeneous alignment of the nematic layer and at exactly 90° angular displacement the chirality of the twisted nematic structure generally includes a predominance of one handedness with the presence of the other handedness. Exactly 0° and 90° are therefore not preferred in utilizing the twisted nematic structure and at 90° there is non-uniformity of chirality.

EXAMPLE I

A nematic liquid crystalline composition is prepared by mixing one part by weight p-cyanophenyl-p-butyl benzoate (available from Aldrich Chemical Co., catalog number 18-032-7) and one part by weight p-cyanophenyl-p-heptyl benzoate (available from Aldrich Chemical Co., catalog number 18-031-9). Anthracene, an extrinsically optically active material is dissolved in the nematic composition in an amount comprising about one percent by weight of the total solution.

A sandwich member is formed by placing the nematic-additive solution between two quartz substrates treated by the Chatelain rubbing technique. Both substrates are rubbed uniformly in the same direction and, after the nematic-additive solution is placed on the bottom substrate the top substrate is placed on the layer of solution and rotated counterclockwise about 45°. The nematic assumes the twisted nematic structure with a left-handed helix.

The absorption spectrum of the anthracene additive is analyzed with a Cary 15 Spectrophotometer. The analysis is shown in FIG. 1.

The sandwich member is placed in a Cary 61 Spectropolarimeter operating in the circularly dichroic mode and the circular dichroism spectrum of the anthracene additive is measured taking into account the polarization properties of the photomultiplier. Circular dichroism is exhibited within the optical transitions of the anthracene molecules. The observed circular dichroism is shown in FIG. 1.

EXAMPLE II

An isotropic solution of anthracene in chloroform solvent is placed in the Cary 61 spectropolarimeter operating in the circularly dichroism mode and the absorption spectrum of the anthracene is analyzed for circular dichroism. Circular dichroism is not exhibited. This indicates that the circular dichroism exhibited by anthracene in Example I is induced by contact with the twisted nematic structure.

EXAMPLE III

The sandwich member of Example I is heated above the isotropic temperature for the nematic liquid crystalline composition. While so heated, the absorption spectrum of the anthracene additive is analyzed with a Cary 61 Spectropolarimeter operating in the circularly dichroism mode. Circular dichroism is not exhibited.

The sandwich member is allowed to cool below the isotropic temperature and transforms from the isotropic to the twisted nematic structure. The circular dichroism of FIG. 1 is exhibited upon cooling. This demonstrates that circular dichroism is induced within the absorption spectrum of anthracene in contact with the twisted nematic structure.

EXAMPLE IV

The sandwich member of Example I is prepared except that the extrinsically optically active additive is methylene blue rather than anthracene. A helium neon laser emits radiation at 6328A, within the methylene blue absorption band, is utilized. The 6328A radiation is directed to first pass through a linear polarizer (the emerging beam containing equal amounts of right hand circularly polarized light and left hand circularly polarized light), to pass through the sandwich member, and then to pass through a quarter wave platelinear polarizer combination and impinge an observer's eye.

The quarter wave plate can be oscillated between two positions 90° apart, each position providing an orientation of the retardation axis of the quarter waveplate to the transmission direction of the second linear polarizer of about 45°. The intensity of light is observed for each of the two positions of the quarter waveplate retardation axis and is more intense at one position than the other. The sandwich member is heated to the isotropic temperature of the liquid crystalline material and the light intensity becomes equal at both positions of the quarter waveplate.

The sandwich member is removed and the observation through the oscillating quarter waveplate is continued. It is noted that the light at each position is of equal intensity and that the intensity at each position is greater than the intensity observed at the respective position prior to removal of the sandwich member.

This demonstrates that the relative amounts of right handed and left handed circularly polarized light components is altered by the circular dichroism induced in the visible absorption band of the methylene blue.

EXAMPLE V

The sandwich member of Example I is prepared as in Example I and placed in the Cary 61 Spectropolarimeter operating in the circularly dichroism mode. In the circularly dichroic mode, the spectropolarimeter emits alternately left-handed circularly polarized light pulses and right handed circularly polarized light pulses of equal intensity. These pulses are of selectively variable wavelength and are produced by passing monochromatic light through a linear polarizer and a Pockel cell quarter waveplate (a single crystal of potassium dideuterium phosphate).

When the circular dichroism is measured within the 360 nm absorption band of the anthracene additive in the twisted nematic mesophase, a negative CD band indicates more left-handed circularly polarized light intensity than right handed circularly polarized light intensity, indicating (since the pulses were initially of equal intensity) that a larger percentage of the right-handed circularly polarized light was absorbed by the anthracene than the percentage of left handed circularly polarized light so absorbed. By convention, the circular dichroism is of positive sign when $\epsilon_L > \epsilon_R$. The same results occur with light pulses at about 380 nm.

EXAMPLE VI

Example V is repeated except that, in preparing the sandwich member according to Example I, the top substrate is rotated clockwise about 45° and imparts a right handed sense of twist or chirality to the resulting twisted nematic structure. The intensity detector indicates more right hand circularly polarized light intensity than left hand circularly polarized light intensity emerging through the sandwich members. Since the pulses were of original equal intensity, this indicates that a larger percentage of left hand circularly polarized light was absorbed by the anthracene than the percentage of right hand so absorbed. By convention, the circular dichroism is of negative sign when $\epsilon_R > \epsilon_L$.

Thus, circular dichroism of positive sign is exhibited at 360 nm and 380 nm.

EXAMPLE VII

The sandwich member of Example I is prepared according to Example I except that the glass substrates are coated with indium oxide and the indium oxide coatings are treated by the Chatelain rubbing technique. The twisted nematic structure is achieved in accordance with Example I. An A.C. voltage of about 50 volts at 10 KHz is applied to the indium oxide coatings to apply an electric field across the twisted nematic while the member is being examined as in Example I for circular dichroism induced in the anthracene additive. Upon application of the field, the nematic becomes homeotropically aligned and circular dichroism is no longer observed within the absorption bands of the anthracene.

Example VII demonstrates that the application of electric fields at or above the threshold for twisted nematic to homeotropic nematic transition extinguishes the circular dichroism induced in the extrinsically optically active additive.

EXAMPLE VIII

Example VII is continued and the A.C. voltage adjusted to about 1.9 volts A.C. at 10 KHz. The induced circular dichroism reappears and is more intense (of increased magnitude) at about 360 nm and about 380 nm than the circular dichroism induced at those wavelengths in Example I in the absence of an applied electrical field.

The voltage is readjusted to about 2 volts A.C. at 10 KHz and the induced circular dichroism decreases in magnitude at the about 360 nm and about 380 nm wavelengths.

EXAMPLE IX

Examples VII and VIII are repeated except that one of the indium oxide coatings is provided in image configuration. The Example VII extinction of circular dichroism and the Example VIII magnitude changes in circular dichroism now occur in imagewise configuration.

The invention described herein may be practiced with conventional apparatus, the availability of which is well known to those people skilled in the art of information transfer. In accordance with the present invention, however, a novel electro-optic effect, circular dichroism induced in normally extrinsically optically active materials in contact with twisted nematic liquid crystalline compositions, is utilized to generate the information which is transferred and subsequently converted into synchronized signals at the transmitting station and optionally subsequently reconverted into optical information at the receiving station utilized to address an optical information recording device at the receiving station.

Figure 2:
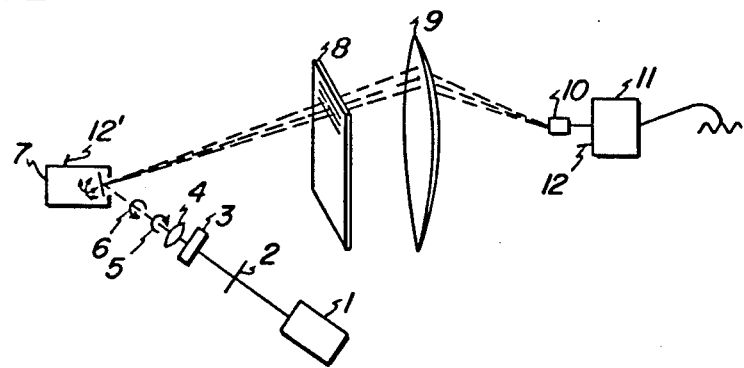
FIG. 2 is a schematic illustration of one embodiment of a scheme whereby information on circular dichroisis read from a liquid crystalline film by the transmission of light therethrough and the conversion of the information so read into synchronized signals.

Referring now to FIG. 2, there is seen a light source 1 which generates light of very narrow range of wavelengths, preferably of about a single wavelength, the optical output of which is linearly polarized by linear polarizer 2. The linearly polarized light passing through linear polarizer 2 then passes through an electro-optic modulator which produces alternately right-hand circularly polarized light and left-hand circularly polarized light, in sequence, to produce pulses of light which in succession in the direction of propagation, comprises a repetitive sequence of alternating right-hand circularly polarized light pulse followed by a left-hand circularly polarized pulse and so forth. For convenience of description, the term circularly polarized pulses (hereafter denoted CPLP) is used herein to refer to the sequence of a right-hand circularly polarized pulse of light followed by a left-hand circularly polarized pulse of light followed by a right-hand circularly polarized pulse of light followed by a left-hand circularly polarized pulse of light and so on, in repetitive sequence. The CPLP then passes through a focusing lens 4 which focuses the CPLP onto scanner 7 which, by reflection, is adapted to direct the CPLP across the surface of liquid crystalline film 8 in the direction from left to right or right to left (as in a line of typing) and in the direction of from top to bottom to top (as in the spacing of typed lines). The CPLP passes through liquid crystal film 8, in optical transmission. Since, as previously stated above, circular dichroism is by definition the difference in absorption of left-hand circularly polarized light and right-hand circularly polarized light, or vice verse, depending upon the sign of the circular dichroism, it can be seen that the CPLP is affected in the relative amounts of magnitude or strength of the individual right-hand circularly polarized light pulses and left-hand circularly polarized light pulses passing through liquid crystal film 8. The CPLP is thus changed from CPLP comprising right-hnad circularly polarized light pulses and left-hand circularly polarized light pulses of equal magnitude which exists prior to impingement of liquid crystal film 8 into a CPLP which is modulated in accordance to the presence or absence of circular dichroism at a particular point in liquid crystal film 8, in accordance with the sign of circular dichroism present at a particular point in film 8, in accordance with the magnitude of circular dichroism present at a particular point in film 8, and so forth, as previously described above. The modulated CPLP then passes through a collecting lens 9 which focuses the modulated CPLP from any point in liquid crystal film 8 into intensity detector 10. Intensity detector 10 detects alternate strengths or magnitudes of right-handed circularly polarized light and left-handed circularly polarized light and, in that sense, reads the modulated CPLP. A signal is generated by the intensity detector 10 which is modulated in real time in accordance with the intensity detected. The modulated signal from detector 10 enters signal transmitter and processor 11 which generates synchronized pulses or signals for transmission to the receiving station where it is responded to by the readout scheme depicted in FIG. 3.

Figure 3:
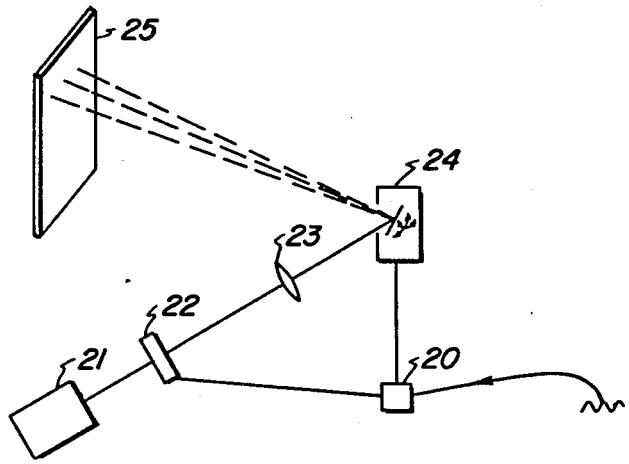
FIG. 3 is a schematic illustration of a scheme whereby the synchronized signals produced by the schemes depicted in FIGS. 2 and 4 are converted to optical information which addresses optical information recording devices.

The synchronized pulse or signal produced by signal transmitter and processor 11 in FIG. 2 is received at the receiving station by synchronizer 20, schematically illustrated in FIG. 3. Synchronizer 20 is operatively connected to modulator 22, which modulates the intensity of light from light source 21, and is also operatively connected to scanner 24 which, by reflection, directs intensity modulated light from light source 21 upon the surface of optical information receiving member 25. In real time, synchronizer 20 positions scanner 24 so that the point of receiving member 25 that is addressed by the reflected intensity modulated light corresponds in an information sense (for example, the same relative position in an image) to the point in liquid film 8 of FIG. 2 which produced the modulation in the CPLP detected by intensity detector 10 and transmitted by element 11 of FIG. 2 in the form of synchronized pulses of signals. In this manner, the loop is closed between a point in liquid crystal film 8 of FIG. 3 and a corresponding point in an information sense in receiving member 25 of FIG. 3. Thus, it can be seen that the image transfer system herein described is a system which reads information bit by bit. The information read, of course, is information concerning circular dichroism in the normally extrinsically optically active material in contact with the nematic liquid crystalline material of film 8 in FIG. 2.

In operation, the readout scheme illustratively depicted in FIG. 3 can be practiced with any conventional readout scheme and by using apparatus well known to those skilled in the art. Preferably, light source 21 in FIG. 3 is identical with light source 1 of FIG. 2 in order to minimize any distortions, difficulties, or inconveniences caused by the use of two different sources in a synchronized mode. Lasers are preferred as a light source for the reasons stated above. Modulator 22 can be selected from a broad range of modulators but is to be selected as to be compatible with receiving member 25. That is, if receiving member 25 is micro-film or a photoconductive drum, modulator 22 is conveniently an intensity modulator which modulates the intensity of the output of light source 21 into pulses of varying intensities corresponding to the relative strengths of right-hand circularly polarized light and left-hand circularly polarized light transmitted through liquid crystal film 8 of FIG. 2. As clearly indicated, this is on a synchronized basis so that the modulated light striking any particular point on receiving member 25 of FIG. 3 presents information to that particular point on receiving member 25 which corresponds to the circular dichroism information on the corresponding particular point, in the informational sense, of liquid crystal film 8 of FIG. 2. In this connection, input element 12 of transmitter and processor 11 of FIG. 2 is operatively connected to output element 12' of scanner 7 of FIG. 2 so that the synchronized pulses or signals generated by transmitter 11 contains information on the position of scanner 7 as well as information on the relative strengths of right-handed circularly polarized light and left-handed circularly polarized light.

Referring now to FIG. 4, there is seen schematically illustrated on embodiment of a read in scheme which is the reflection equivalent of the transmission scheme depicted in FIG. 2. That is, like numerals refer to like elements. Read in by optical reflection is accomplished in FIG. 4 by the insertion of a beam splitter such as a half-silvered mirror 31 between scanners 7 and liquid crystal film 8. Beam splitter 31 acts essentially an a one way mirror, allowing light reflected from scanner 7 through lens 30 to pass through beam splitter 31 and impinge upon liquid crystal film 8 but which prevents light reflected from liquid crystal film 8 from passing back through beam splitter 31, but rather, causes light reflected from film 8 to be directed into collecting lens 9.

Any suitable apparatus may be selected for the particular elements depicted in FIGS. 2, 3, and 4 so long as they are selected to be system compatible. Typical suitable apparatus for the various elements include, for example, a raster scanner or digital scan scanner for scanner 7 and scanner 24; a laser or an incandescent light source used in conjunction with appropriate filters and modulators for light source 1 and light surce 21; Polaroid Sheet for linear polarizer 2, available from the Polaroid Corporation; quarter waveplates available from the Polaroid Corporation oscillated between two positions approximately 90° apart, each position providing an orientation of the retardation axis of the quarter waveplate to the transmission direction of the linear polarizer 2 of about 45°, can conveniently constitute electro-optic modulator 3; liquid crystal film 8 can comprise any of the aforementioned nematic liquid crystalline materials in contact with any of the aforementioned normally extrinsically optically active materials, said materials being either dispersed as particles in liquid crystal film 8 or being in layer configuration in contact with the twisted nematic liquid crystalline material of film 8 or dissolved in film 8; a square law detector, such as, for example, the EG and G light mike available from the EG and G Company; signal transmitter and processor 11 can be selected from a host of electronic amplifiers currently commercially available; similarly, intensity modulator 22, synchronizer 20, optical information recording element 25, beam splitter 31 and the various lenses can be selected from any of the many commercially available respective elements.

As can be seen from the above description, circular dichroism is induced in normally extrinsically optically active materials which are in contact with the twisted nematic structure of nematics liquid crystalline materials. This inducement of circular dichroism results in a circular dichroism in the absorption band of the extrinsically optically active insoluble material. The induced circular dichroism can be selectively created, and can be selectively varied in intensity by the application of an electrical field. Thus, differences in circular dichroism can be selectively created at predetermined locations on liquid crystal film 8; such as, for example, an imagewise pattern or circular dichroism against a background of no circular dichroism, or, an imagewise configuration of circular dichroism which is of relatively great magnitude or strong intensity against a background of circular dichroism which is of relatively low intensity or small magnitude.

It will be appreciated, of course, that the light produced by light source 1 and light source 21 should at least contain light at a wavelength within the absorption band of the normally extrinsically optically active materials in which circular dichroism is induced by contact with the twisted nematic structure of the nematic liquid crystalline material.

While the invention has been described in detail with respect to certain embodiments thereof it is not intended to be limited thereto, but rather it will be appreciated by those skilled in the art that modifications and variations are possible which are within the spirit of the invention and the scope of the claims.

For example, scanners 7 and 24 may be selected such that they independently operate in timed sequence with respect to corresponding informational points of liquid crystal film 8 and receiver or recorder member 25. In that case, output 12' and input 12 in FIGS. 2 and 4 may additionally be selected so that they need not be operatively connected to scanner 24 in the readout scheme.

Generally speaking, this invention involves a bit by bit read in sequence of liquid crystal induced circular dichroism such as, for example, an imagewise pattern of liquid crystal induced circular dichroism intensity, induced in normally extrinsically optically active material in contact with the twisted nematic structure of nematic liquid crystalline materials. Any suitable apparatus may be used such as, for example, the use of a light source whose output if first linearly polarized and subsequently coverted into alternating left and right hand circularly polarized light pulses by means of a properly oriented electro-optic modulator. Other suitable apparatus such as, a lens, scanner, and collecting lens can be employed to transfer the liquid crystal induced circular dichroism information bit by bit into an intensity detector-signal transmitter and processor component which detects the alternate strengths of left and right handed circularly polarized light. The apparatus is selected and operatively connected, typically so that pulses of both right-hand circularly polarized light and left-hand circularly polarized light in the CPLP impinge upon the same information point of the liquid crystal film; so that comparison can be made by the intensity detector as to the relative strengths of right and left-hand circularly polarized light either transmitted (as in FIG. 2) or reflected (as in FIG. 4) by the material in which circular dichroism is induced; so that if, for example, there is no difference in absorption of left and right-handed circularly polarized light, the synchronizer in the information transfer read in system and which controls the intensity modulator and scanner of the readin system, will not be activated; and, so that when circular dichroism is detected an electronic pulse is sent to the synchronizer so that the synchronizer activates the intensity modulator and the scanner allowing the output (readout) light source, such as a laser beam, to write onto microfilm or a photoconductive drum or other optical information recording device to thereby produce a permanent record of the circular dichroism image.

Further, the optical properties of the normally extrinsically optically active material can be altered to provide the capability of reading image or background areas to provide a corresponding positive or negative readout. For example, materials which undergo chromic changes such as photochromic, electrochromic, thermo-chromic, crystallization, isomerization, dimerization, oligomerization, and piezochromic changes can be employed to selectively shift the absorption bands of the extrinsically optically active materials in contact with the twisted nematic structure of nematic liquid crystalline materials.

This selective shift can be caused to occur either in imagewise or background areas of pre-existing images or can be utilized to create the image and background.

The result of this selective shift is that the induced circular dichroism occurs at different wavelengths.

For example, a thermoplastic insoluble material such as lead iodide changes color from red to yellow upon application of heat. If heat is applied in imagewise configuration to either a dispersion or layer of lead iodide in contact with the twisted nematic structure of a nematic liquid crystalline material, then a yellow image on a red background results. If the dispersion or layer is examined by light of a wavelength within the absorption bands of the imagewise configured yellow lead iodide and outside the absorption bands of the background configured red lead iodide, the circular dichroism in image areas can be monitored by the examining light but the examining light cannot monitor the circular dichroism induced in the background configured red lead iodide. The readout is a positive image. Vice versa, if the same dispersion or layer is examined by light of a wavelength within the absorption bands of the red lead iodide (background) and outside the absorption bands of the yellow-lead iodide (image) a negative readout is obtained because the circular dichroism of only the red lead iodide can be monitored by the examining light.

Any of the aforementioned chromic changes can be used to provide similar selective shifting of the absorption bands of the insoluble material. For example, cis to trans isomerization of azo compounds can be utilized to provide such a selective shift.

It will be appreciated that insoluble material having different absorption bands can be utilized to form a fixed image and background, each of which image and background has circular dichroism induced at wavelengths different from the other.

Finally, it will be appreciated that the inclusion of a photoconductor in contact with the nematic liquid crystalline material between two electrodes can be employed. This will permit imagewise configuration of either the existence or intensity of circular dichroism (CD) in film 8 with actinic input. Either A.C. or D.C. voltages can be applied between the two electrodes to cause, upon exposure of the photoconductor with actinic radiation, a change in CD intensity by tilting of the nematic molecules or extinction of the CD by transition of the nematic to the uniaxial homeotropic texture.

What is claimed is:

1. A method for transferring information, comprising:
   a. providing in the twisted nematic structure a nematic liquid crystalline material in contact with an extrinsically optically active material having an absorption band within which circular dichroism is induced by said contact with the twisted nematic structure of said nematic liquid crystalline material;
   b. directing at least one right-handed circularly polarized light pulse and at least one left-handed circularly polarized light pulse upon the same point of interest of said material, said light pulses being of equal intensity and within the absorption band of said extrinsically optically active material; and
   c. subsequently converting the relative magnitude of said at least one right and left-handed circularly polarized light pulses into a signal.

2. The method of claim 1 wherein said extrinsically optically active material is insoluble in said nematic liquid crystalline material.

3. The method according to claim 2 wherein said insoluble material is dispersed in said nematic liquid crystalline material.

4. The method of claim 3 wherein said insoluble material constitutes from about 0.01% to about 90% by weight of the dispersion.

5. The method of claim 2 wherein said insoluble material is in layer configuration.

6. The method of claim 1 further including, between step (a) and step (b) the step of selectively shifting the absorption band of some of said optically active material.

7. The method of claim 1 wherein said extrinsically optically active material is soluble in said nematic liquid crystalline composition.

8. The method of claim 7 wherein the extrinsically optically active material comprises from about 0.01% to about 90% by weight of the resulting solution.

9. The method of claim 1 wherein said nematic comprises a mixture of p-cyanophenyl-p-butyl benzoate and p-cyanophenyl-p-heptyl benzoate.

10. The method of claim 1 wherein said nematic liquid crystalline composition comprises a smectic liquid crystalline material having positive dielectric anisotropy.

11. The method of claim 1 wherein said nematic liquid crystalline composition comprises a mixture of nematic liquid crystalline materials of positive and negative dielectric anisotropy, said composition having a net positive dielectric anisotropy.

12. The method of claim 1 wherein said extrinsically optically active material comprises a member selected from the group consisting of: aromatic compounds, azo compounds; nitro compounds; nitroso compounds; anil compounds; carbonyl compounds; thiocarbonyl compounds; alkenes; alkanes; heterocyclic compounds, and mixtures thereof.

13. The method of claim 12 wherein said extrinsically optically active material has an absorption band in the visible region.

14. The method of claim 13 wherein said extrinsically optically active material is selected from the group consisting of anthracene and methylene blue.

15. An information transfer device, comprising:
   a. a nematic liquid crystalline material in the twisted nematic structure in contact with an extrinsically optically active material having an absorption band within which circular dichroism is induced by said contact with the twisted nematic structure of said nematic liquid crystalline material;
   b. means for sequentially producing right-handed circularly polarized light pulses and left-handed circularly polarized light pulses of equal intensity and within the absorption band of said extrinsically optically active material;
   c. means for directing at least one of said right-handed circularly polarized light pulses and at least one of said left-handed circularly polarized light pulses upon the same point of interst of said extrinsically optically active material;
   d. means for subsequently detecting the relative magnitudes of said at least one right-handed and left-handed circularly polarized light pulses and converting the relative magnitudes into a signal.

16. The device of claim 15 wherein said optically active material is insoluble in said nematic liquid crystalline material.

17. The device of claim 16 wherein said insoluble material is dispersed in said liquid crystalline material.

18. The device of claim 17 wherein said insoluble material constitutes from about 0.01% to about 90% by weight of the dispersion.

19. The device of claim 16 wherein said insoluble material is in layer configuration.

20. The device of claim 15 wherein some of said optically active materials have an absorption band at wavelengths different from that of absorption bands of other of said optically active material.

* * * * *